United States Patent
Himmelsbach et al.

(10) Patent No.: US 10,195,704 B2
(45) Date of Patent: Feb. 5, 2019

(54) LIFT PIN FOR SUBSTRATE PROCESSING

(71) Applicant: Infineon Technologies AG, Neubiberg (DE)

(72) Inventors: Christian Himmelsbach, Villach (AT); Joachim Hirschler, Villach (AT); Helmut Brunner, Feistritz-Drau (AT)

(73) Assignee: Infineon Technologies AG, Neubiberg (DE)

( * ) Notice: Subject to any disclaimer, the term of this patent is extended or adjusted under 35 U.S.C. 154(b) by 547 days.

(21) Appl. No.: 13/833,616

(22) Filed: Mar. 15, 2013

(65) Prior Publication Data

US 2014/0265098 A1    Sep. 18, 2014

(51) Int. Cl.
*B23Q 7/00* (2006.01)
*H01L 21/687* (2006.01)

(52) U.S. Cl.
CPC ........ *B23Q 7/005* (2013.01); *H01L 21/68742* (2013.01)

(58) Field of Classification Search
CPC ........ H01L 21/68742; H01L 21/68785; H01L 21/68; H01L 21/68714; H01L 21/6875; H01L 21/68764; B23Q 7/005; B24B 41/005; B24B 37/30; B24B 37/34; B24B 37/345; C23C 16/4586; H01J 37/32715
See application file for complete search history.

(56) References Cited

U.S. PATENT DOCUMENTS

| | | | |
|---|---|---|---|
| 6,148,762 A * | 11/2000 | Fukuda et al. | 118/715 |
| 6,435,798 B1 * | 8/2002 | Satoh | 414/217 |
| 6,562,140 B1 * | 5/2003 | Bondestam et al. | 118/715 |
| 2002/0011204 A1 * | 1/2002 | Gujer | C23C 16/405 118/500 |
| 2003/0075387 A1 * | 4/2003 | Wang et al. | 187/250 |
| 2003/0205329 A1 * | 11/2003 | Gujer | C23C 16/405 156/345.51 |
| 2004/0045509 A1 * | 3/2004 | Or et al. | 118/729 |
| 2006/0156981 A1 * | 7/2006 | Fondurulia | C23C 16/4408 118/715 |
| 2006/0156987 A1 * | 7/2006 | Lai | C23C 16/4586 118/728 |
| 2006/0219178 A1 * | 10/2006 | Asakura | H01L 21/68742 118/728 |
| 2007/0089672 A1 * | 4/2007 | Shimamura | C23C 8/00 118/504 |
| 2007/0159615 A1 * | 7/2007 | Horiuchi | 355/72 |
| 2007/0212200 A1 * | 9/2007 | Ueda et al. | 414/217 |
| 2008/0149032 A1 * | 6/2008 | Jung | C23C 16/4586 118/728 |
| 2009/0155025 A1 | 6/2009 | Lerner et al. | |
| 2010/0101491 A1 * | 4/2010 | Aida | 118/502 |
| 2010/0187777 A1 * | 7/2010 | Hao | 279/142 |
| 2011/0315080 A1 * | 12/2011 | Choi et al. | 118/723 E |

* cited by examiner

Primary Examiner — Christopher M Koehler
Assistant Examiner — Joel Crandall
(74) Attorney, Agent, or Firm — Slater Matsil, LLP

(57) ABSTRACT

Lift pins and devices having lift pins are provided. According to an aspect, a lift pin may have a tapered distal portion. According to another aspect, a lift pin may have two portions threadedly engaged with each other. According to yet another aspect, a lift pin may be mounted to a lifting plate with slackness.

20 Claims, 3 Drawing Sheets

LIFT PIN FOR SUBSTRATE PROCESSING

TECHNICAL FIELD

The present application relates to a lift pin for substrate processing and to apparatuses comprising such a lift pin.

BACKGROUND

In the processing of substrates, for example, semiconductor wafers for manufacturing semiconductor devices such as integrated circuits, the substrates need to be placed on substrate supports, for example so-called chucks, for processing. In many applications, it is desirable to automatize this placing of substrates on a substrate support for example to increase a throughput of the manufacturing process.

One approach used in the semiconductor industry is to place the substrate on lift pins extending from the substrate support and then to retract the lift pins into holes in the substrate support thereby lowering the substrate on the substrate support. In conventional approaches, often the holes in the substrate support have a significantly greater diameter than the lift pins used e.g. to prevent friction of the lift pin on the substrate support. Therefore, part of the hole remains open when the substrate is lowered on the substrate support. In some applications, for example plasma-based etching, this can lead to etching radicals reaching the backside of the substrate at the holes and therefore to a backside etching of the substrate, which may be undesirable under some circumstances.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

In the following, various embodiments will be described in detail. It should be noted that these embodiments are given only for the purpose of illustration and are not to be construed as limiting the scope of the present application in any way. For example, while an embodiment may be described having a plurality of features, in other embodiments less features and/or alternative features may be provided. For example, in some cases to provide a concise disclosure several features may be described with respect to a single embodiment, while other embodiments may have only one or some of these features.

Features from different embodiments may be combined unless specifically noted otherwise. Moreover, while in the following sometimes a processing of semiconductor wafers like silicon wafers, for example a plasma-based etching of such semiconductor wafers, is used as an exemplary environment, embodiments may be generally used in cases where substrates, including substrates others than semiconductor wafers, are to be placed on a substrate support using one or more lift pins.

In the embodiments described below, lift pins and their application in processing devices will be discussed in detail. A lift pin in the context of the present application is a pin onto which a substrate may be placed and which may be raised or lowered, in particular to lower the substrate onto a substrate support like a chuck.

Figure 1:
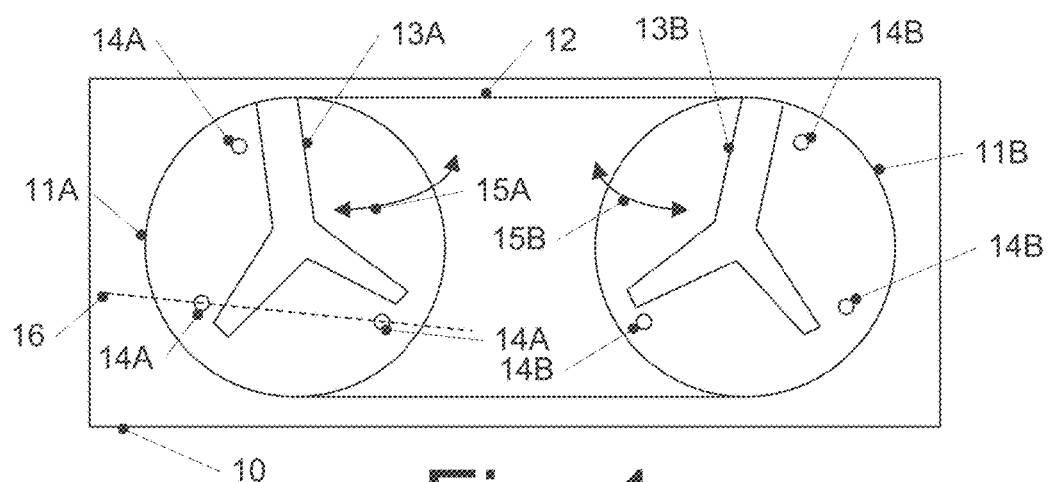
FIG. 1 shows a schematic top view of a processing device according to an embodiment.

Turning now to the figures, in FIG. 1 a schematic top view of a semiconductor processing device is shown. The semiconductor processing device of FIG. 1 may for example be a plasma etching device like a generic plasma resist asher or a plasma isotropic asher. However, generally any kind of suitable processing may be performed in the device of FIG. 1. For example, the device may be a plasma deposition device.

The processing device of FIG. 1 comprises a processing chamber 10 in which two chucks 11A, 11B, each for receiving a semiconductor substrate like a wafer, e.g., a silicon wafer, for processing, are provided on a table 12. The size of chucks 11A, 11B may correspond to or be slightly larger than the size of the substrates to be processed. While two chucks 11A, 11B are provided within processing chamber 10, in other embodiments only one chuck or more than two chucks may be provided. In other embodiments, other substrate supports than chucks may be used for receiving a substrate.

Chuck 11A has holes 14A through which lift pins may extend, and likewise chuck 11B has holes 14B through which pins may extend to receive a substrate. While three holes 14A and three holes 14B are shown, the number of holes and therefore pins is not limited to three, and any number of pins necessary for supporting the substrate may be used.

For each of the chucks 11A, 11B, a paddle-like substrate carrier is provided, namely substrate carrier 13A for chuck 11A and substrate carrier 13B for chuck 11B. Substrate carrier 13A is movable or pivotable as indicated by an arrow 15A, and substrate carrier 13B is movable or pivotable as indicated by an arrow 15B.

To place a substrate on chuck 11A, the substrate may be placed on substrate carrier 13A for example in a position of substrate carrier 13A away from chuck 11A, and then substrate carriers 13*a* may be pivoted as indicated by arrow 15A into the position shown in FIG. 1. Next, lift pins are extended through holes 14A such that they traverse, i.e., pass through, holes 14A and the substrate rests on the lift pins, and substrate carrier 13A is then moved away from chuck 11A without the substrate. Finally, the lift pins are retracted into chuck 11A, thus lowering the substrate onto chuck 11A.

In a similar manner, a substrate may be placed on chuck 11B using substrate carrier 13B and lift pins extending through holes 14B.

After the substrates have been placed on chucks 11A, 11B, processing within processing chamber 10, for example a plasma-based etching or other processing as mentioned above, may be performed. For removing the substrates again, the above-described procedure may be reversed.

Figure 2:
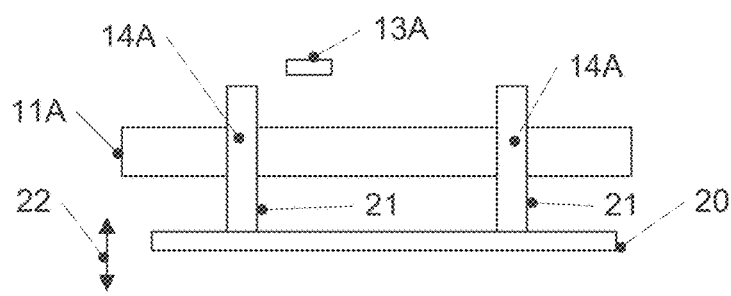
FIG. 2 shows a partial cross-sectional view along a line 16 of FIG. 1.

To illustrate a possible mechanism for extending and lifting lift pins through holes 14A and 14B, in FIG. 2 a schematic cross-sectional view along a line 16 of FIG. 1 is shown. In the schematic representation of FIG. 2, lift pins 21 are mounted to a lift plate 20. When lift plate 20 is moved up or down as indicated by an arrow 22, for example using an electromotor or pneumatic drive (not shown), lift pins 21 are extended through or retracted into holes 14A in chuck 11A. It should be noted that the representation of lift pins 21 in FIG. 2 is to be regarded as schematic only, and possible implementations of lift pins according to embodiments will be described in detail with reference to FIGS. 3-5.

Figure 3:
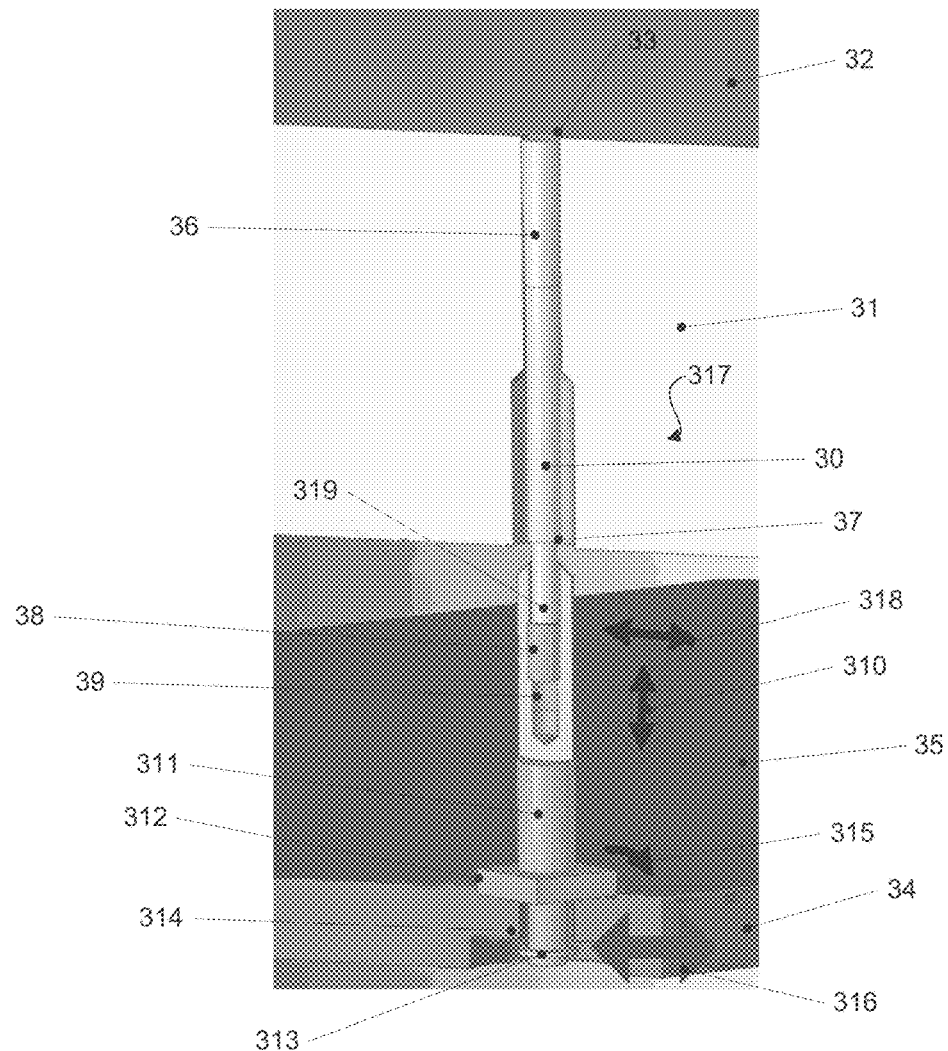
FIG. 3 shows a schematic view of a lift pin according to an embodiment.
Figure 4:
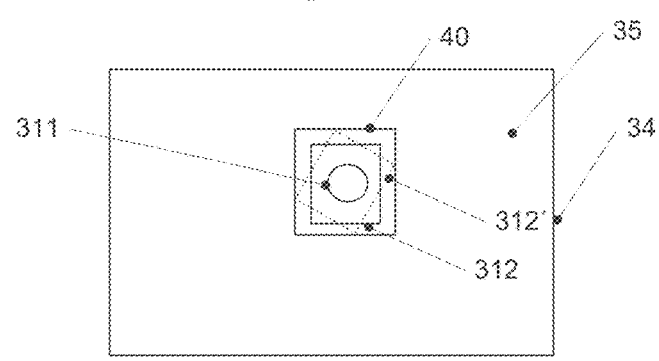
FIG. 4 schematically shows a detail of the lift pin of FIG. 3.
Figure 5:
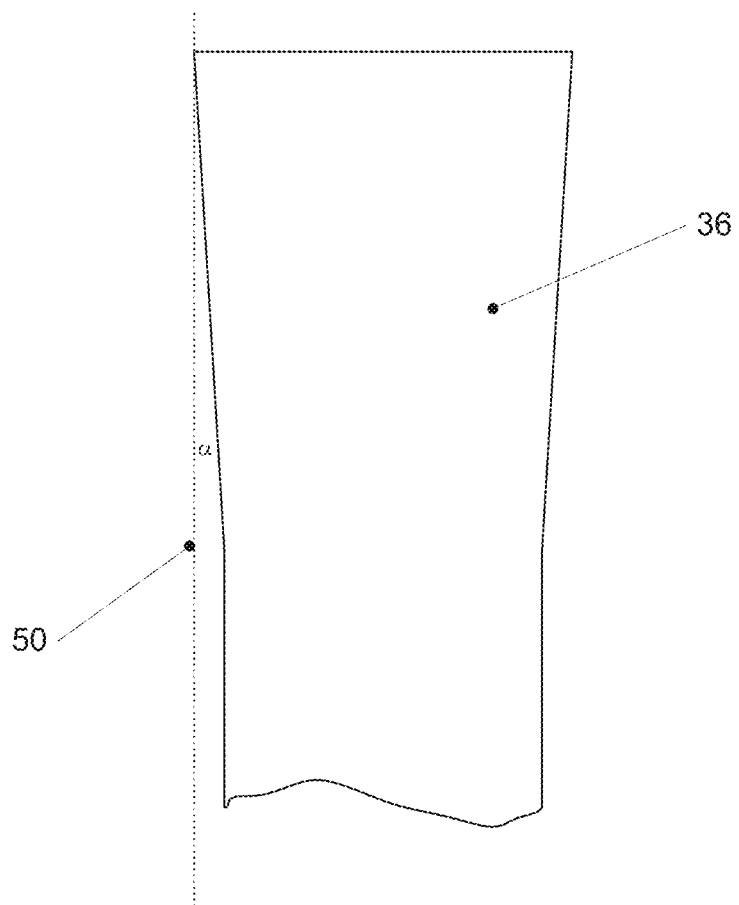
FIG. 5 schematically shows a further detail of the lift pin of FIG. 3.

In FIG. 3, a lift pin 317 according to an embodiment is shown. FIGS. 4 and 5 show details of lift pin 317. While for conciseness lift pin 317 is used to describe various features which may be implemented jointly in lift pins, these features may also be implemented as stand-alone features without the remaining features disclosed in other embodiments of lift pins.

Lift pin 317 in FIG. 3 is mounted to a lift plate 34. An upper surface of lift plate 34 bears reference numeral 35. As already explained with reference to FIG. 2, by moving lift plate 34 lift pin 317 may be extended through a chuck 31 or retracted into chuck 31. In FIG. 3, the retracted position is shown, where a distal end of lift pin 317, i.e., an end away from lift plate 34, is essentially flush with a surface 32 of chuck 31 and essentially closes a hole 33 through which lift pin 317 moves. Generally, a direction or position towards lift plate 34 will be referred to as proximal, while the opposite direction or position will be referred to as distal.

Next, various specific features of lift pin 317 will be discussed in detail.

Lift pin 317 in the embodiment of FIG. 3 comprises an upper portion (distal portion) 30 and a lower portion (proximal portion) 311. For coupling upper portion 30 with lower portion 311, upper portion 30 comprises an external thread 38 at a lower (proximal) end thereof, and lower portion 311 comprises an internal thread 39 at an upper (distal) end thereof, such that upper portion 30 may be screwed into lower portion 311. In other embodiments, lower portion 311 may comprise an external thread, and upper portion 30 may comprise an internal thread.

Via such a threaded connection, an overall length or height of lift pin 317 may be easily adjusted also in the assembled processing device as indicated by an arrow 310. In some embodiments, this may be helpful as for example over many repetitions of production cycles slight misalignments between various lift pins used (for example three lift pins in FIG. 1) may occur, which may be compensated through such an adjustment.

In an embodiment, upper portion 30 and/or lower portion 311 may be made of anodized aluminum. In other embodiments, only the threads (external thread 38 and/or internal thread 39) may be made of anodized aluminum. In some embodiments, one of the threads may be made of anodized aluminum, and the other thread may be made of another material, e.g., stainless steel. In some embodiments, through the anodization process a certain slackness is provided in the threaded connection, such that a movement as indicated by an arrow 318 of upper portion 30 with respect to lower portion 311 becomes possible to some extent. In other embodiments, slackness may be introduced using other materials like stainless steel or plastic like teflon and using non-standard thread diameters. Standard diameters or threads would be for example M3, M4, M5 etc., which are standardized thread dimensions. Such a slackness may help to account for mechanical tolerances, including tolerances due to slight changes of the geometry due to repeated use of the processing device, i.e., repeated raising and lowering of the lift pins. Also, by the slackness provided by threads 38, 39 thermal expansion of chuck 31 may be compensated in some embodiments. A slackness enabled by the threads in this way may be of the order of 20 to 200 µm, 30 to 150 µm or 30 to 100 µm, for example about 40 to 60 µm.

Also, in some embodiments, the anodizing increases the roughness and therefore may prevent undesired (un)screwing movement or loosening of the threads 38, 39 with respect to each other. In other embodiments, other materials may be used, and for example the above-mentioned slackness may be provided by designing the dimensions accordingly, and loosening of the threaded connections may be prevented by other conventional means.

Furthermore, in the embodiment of FIG. 3 lift pin 317, in this case upper portion 30, comprises a step 37 where the diameter of upper portion 30 changes, i.e., the portion below step 37 has a smaller diameter than the portion above step 37. This may serve to increase an angular slackness and in some embodiments may help to prevent debris to fall into threads 38, 39. However, in other embodiments, step 37 may be omitted. A reduced diameter portion 319 below step 37 may have a smaller diameter than external thread 38, which may help to ensure a desired slackness.

In the embodiment of FIG. 3, upper portion 30 further comprises a tapered portion 36 at its distal end. This tapered portion 36 is shown in more detail in FIG. 5. As can be seen, a diameter of the lift pin is thus largest at the distal end thereof, and then the diameter decreases gradually. A tapering angle α between the side of tapered portion 36 and the longitudinal direction 50 of the lift pin (vertical direction in FIG. 5) may be between 0° and 20°, for example between 0° and 10°. Such a relatively small tapering angle may help to reduce wear and friction between the lift pin and the chuck in some embodiments, although larger angles may be used in other embodiments.

By providing the tapered portion 36, in some embodiments a comparatively good sealing of hole 33 may be obtained when the lift pin 317 is in the retracted position (as shown in FIG. 3) while still ensuring a smooth movement of lift pin 317.

To achieve this, a diameter of the distal end of lift pin 317, i.e., the part of tapered portion 36 with the largest diameter, may essentially correspond to the diameter of hole 33, for example may be some percent, for example less than 15% or less than 5%, smaller than the diameter of hole 33.

In the embodiment of FIG. 3, lower portion 311 is mounted to lifting plate 34 in a loose manner, i.e., allowing some slackness thus allowing both a rotational movement as indicated by an arrow 315 and a lateral movement as indicated by an arrow 316.

To this end, a portion of lower portion 311 extending through a hole 314 in lifting plate 34 has a smaller diameter than hole 314, for example a diameter which is between 10% and 40% smaller, for example between 25 and 35% smaller. For example, hole 314 may have a diameter of about 7 mm, while the portion of lower portion 311 extending through hole 314 may have a diameter of approximately 4.7 mm. However, these numerical values serve only for illustration, and other values may be used as well. Through this slackness, a smooth moving of the pin through chuck 31 may be ensured, and rough mechanical tolerances, movement, wear out also thermal expansion may be compensated for, for example also when assembling the processing device. In particular, in this way a self-adjusting of the lift pin may be provided in some embodiments such that for example after one or a few lifting/lowering motions lift pin 317 moves through chuck 31 with reduced or minimized friction.

To secure lift pin 317 in hole 314, in FIG. 3 above hole 314 lift pin 317 has a rectangular, for example square-shaped, plate 312 which is larger than hole 314. On a lower side, a snap ring 313 is provided. It should be noted that in other embodiments, a rectangular or other plate may be provided instead of snap ring 313, and/or a snap ring may be provided in place of plate 312.

In an embodiment, rectangular plate 312 is provided in a rectangular recess in lift plate 34. This is shown in a schematic top view in FIG. 4, where reference numeral 40 denotes a rectangular recess in surface 35 of lift plate 34. In an embodiment like the embodiment shown, the rectangular recess 40 is dimensioned such that plate 312 may not make a full turn within recess 40, but after some turning a corner of plate 312 hits a wall of recess 40 as shown in dotted lines bearing reference numeral 312'. In this way, an amount of turning or rotation as indicated by arrow 315 may be limited and thus a rotation limiting mechanism is provided. This may be helpful in some cases to allow a height adjustment of lift pin 317 through threads 38, 39 simply by turning a distal end portion of lift pin 317. In other embodiments, rotation may be limited in other ways. In still other embodiments, a full rotation by 360° may be possible. In other embodiments, other plate shapes and/or other recess shapes may be used, for example triangular shapes, pentagonal shapes, other polygonal shapes or elliptical shapes.

As already mentioned above, while the embodiment of FIG. 3 exhibits a plurality of different features, in other embodiments less features may be provided. For example, some embodiments may only have tapered portion 36, or only a loose coupling allowing slackness between the lift pin and lift plate 34, or only a threaded connection likes threads 38, 39. In other embodiments, only some of these features, but not all of these features may be implemented. Threads 38, 39 may be provided with or without step 37.

As can be seen, various modifications and variations are possible, and the embodiments described serve only as examples. Therefore, these embodiments are not to be construed as limiting the scope of the present application.

What is claimed is:
1. An apparatus comprising:
a lift pin comprising:
a distal end; and
a proximal end; and
a lifting plate fixed to the proximal end of the lift pin, wherein the lift pin is fixed to the lifting plate with slackness to allow movement of the lift pin in a lateral direction parallel to the lifting plate, wherein, for providing the slackness, a proximal part of the lift pin traverses a hole of the lifting plate, a diameter of the proximal part being at least 10% smaller than a diameter of the hole of the lifting plate, wherein the lifting plate is fixed to the lift pin such that the lifting plate and the lift pin move together in a vertical direction when the lifting plate is moved in the vertical direction perpendicular to the lifting plate,
wherein the lift pin comprises a distal portion comprising the distal end and a proximal portion comprising the proximal end, the distal portion comprising a first thread at an end opposite the distal end and the proximal portion comprising a second thread at an end opposite the proximal end, and
wherein the first thread is configured to engage the second thread with slackness in the thread connection measured orthogonal to a direction defined by a direction between the distal end and the proximal end, the slackness in the thread connection being between 40 µm to 60 µm.
2. The apparatus of claim 1, wherein the lift pin further comprises a step between the distal end and the proximal end, a diameter of the lift pin at a side of the step closer to the distal end being greater than a diameter of the lift pin at a side of the step closer to the proximal end.
3. The apparatus of claim 1, wherein the first thread is one of an internal thread and an external thread, and the second thread is the other one of an internal thread and an external thread.
4. The apparatus of claim 1, wherein the first thread and the second thread enable a length adjustment of the lift pin.
5. The apparatus of claim 1, wherein at least one of the first thread and the second thread is made of anodized aluminum, stainless steel with non-standard diameter or plastic with non-standard diameter.
6. The apparatus of claim 1, wherein the lift pin is provided with a snap ring on a proximal side of the hole of the lifting plate.
7. The apparatus of claim 1, wherein the lift pin is provided with a plate on a distal side of the lifting plate.
8. The apparatus of claim 7, wherein the plate is accommodated in a recess of the lifting plate, the recess being dimensioned such that a rotating motion of the plate within the recess is limited.
9. The apparatus of claim 1, further comprising a rotation limiting mechanism to limit a rotation of the lift pin within the lifting plate.
10. The apparatus of claim 1, wherein the lift pin further comprises a tapered portion at the distal end, a diameter of the tapered portion decreasing from the distal end towards the proximal end, and wherein a tapering angle of the tapered portion is less than 20°.
11. The apparatus of claim 10, wherein the tapering angle is less than 10°.
12. The apparatus of claim 1, wherein the apparatus is configured to move relative to a chuck.
13. An apparatus comprising:
a lifting plate comprising a hole;
a lift pin, wherein a proximal portion of the lift pin traverses the hole of the lifting plate, wherein a diameter of the proximal portion is at least 10% smaller than a diameter of the hole to provide a slackness, and wherein the lift pin is rotatable with respect to the lifting plate; and
a rotation limiting mechanism to limit a rotating of the lift pin with respect to the lifting plate to a predefined angular range smaller than a full turn of the lift pin,
wherein the rotation limiting mechanism comprises a plate of the lift pin, wherein the plate is accommodated in a recess of the lifting plate, and wherein the recess is dimensioned such that a rotating motion of the plate within the recess is limited such that, in a first position, a perimeter of the plate is spaced apart from a perimeter of the recess and, in a second position, at least a part of the perimeter of the plate is in contact with the perimeter of the recess.
14. The apparatus of claim 13, wherein the diameter of the proximal portion is at least 25% smaller than a diameter of the hole.
15. The apparatus of claim 13, wherein the lift pin comprises a tapered distal end.
16. The apparatus of claim 13, wherein a length of the lift pin is adjustable.
17. The apparatus of claim 13, further comprising a chuck, the chuck comprising a through hole to accommodate a part of the lift pin.
18. A lift pin comprising:
an elongated distal portion comprising a first thread; and
an elongated proximal portion comprising a second thread, wherein the first thread engages the second thread such that a longitudinal direction of the elongated distal portion corresponds to a longitudinal direction of the elongated proximal portion, wherein the first thread engages the second thread with a slackness measured orthogonal to the longitudinal direction, the slackness being between 20 µm to 150 µm, wherein the lift pin further comprises a tapered portion at the elongated distal portion, a diameter of the tapered portion decreasing from the elongated distal portion towards the elongated proximal portion, and wherein a tapering angle of the tapered portion is less than 20°.

19. The lift pin of claim 18, wherein the first thread and the second thread provide a length adjustment of the lift pin.

20. The lift pin of claim 18, wherein the tapering angle is less than 10°.

* * * * *